United States Patent [19]

Anttila

[11] Patent Number: 5,382,296

[45] Date of Patent: Jan. 17, 1995

[54] METHOD FOR CLEANING SEMICONDUCTOR PRODUCTS

[75] Inventor: Olli Anttila, Espoo, Finland

[73] Assignee: Okmetic Oy, Espoo, Finland

[21] Appl. No.: 113,965

[22] Filed: Aug. 30, 1993

Related U.S. Application Data

[63] Continuation of Ser. No. 840,078, Feb. 20, 1992, abandoned.

[30] Foreign Application Priority Data

Feb. 27, 1991 [FI] Finland .................................. 910946

[51] Int. Cl.$^6$ ................................................. C23G 1/02
[52] U.S. Cl. ................................................. 134/3; 134/41
[58] Field of Search ....................................... 134/3, 41

[56] References Cited

U.S. PATENT DOCUMENTS 4,917,123  4/1990  McConnell et al. .................. 134/95

FOREIGN PATENT DOCUMENTS 2709802  9/1978  Germany .
2950541  6/1981  Germany .

Primary Examiner—Richard O. Dean
Assistant Examiner—Zeinab El-Arini
Attorney, Agent, or Firm—Smith-Hill and Bedell

[57] ABSTRACT

The invention relates to a method for cleaning a semiconductor product of particles accumulated on its surface and of metallic and organic contamination. According to the invention, the washing of the semiconductor product is carried out with an acid-water solution with a dilution ratio between $1:10^6 - 1:10^3$ advantageously between $1:10^5 - 1.0^4$. Advantageously the employed acid is for instance hydrochloric acid, nitric acid, acetic acid or hydrofluoric acid.

16 Claims, No Drawings

METHOD FOR CLEANING SEMICONDUCTOR PRODUCTS

This is a continuation of application Ser. No. 07/840,078 filed Feb. 20, 1992 now abandoned.

BACKGROUND OF THE INVENTION

The present invention relates to a method for cleaning semiconductor products of particles attached to the surface of the said product, as well as of metallic, inorganic and organic contamination.

The production of semiconductors such as silicon wafers is normally started with essentially pure silicon material. This material is grown in a pyrometallurgical process into a bar-like single silicon crystal, which is further cut to thin disk-like slices. Two important criteria for silicon wafers, used for instance in circuit building in the electronic industry, are extreme smoothness and purity. Even slight levels of impurities, as well as small irregularities of surface, make the obtained semiconductor product unfit for use. In order to remove impurities from the surface of the semiconductor product, the product is cleaned at various stages of the production process.

The purpose of washing the semiconductor product is to remove impurity particles accumulated on the surface of the wafer, as well as metallic and organic contaminations. Alkaline hydrogen peroxide solutions, the most popular among which is ammonia-hydrogen peroxide-water solution, are very efficient in removing impurity particles from the surface of a semiconductor product. In generally used ammonia-hydrogen peroxide-water solutions, the dilution ratio is for instance 1:1:5, which means that the solution contains one part ammonia and one part hydrogen peroxide per five parts water. However, the operating temperature of this kind of washing solution is about 70° C., which means that the solution must be separately heated in order to make it ready for use. In this type of alkaline solution, some metals—for example iron, zinc and aluminium—tend to accumulate on the surface of the semiconductor product during the washing stage. For removing the said metals, there are generally used hydrochloric acid-hydrogen peroxide-water solutions, but after a washing with these solutions, the surface of the semiconductor product easily attracts particles. Another suggestion is to use weak ammonia-hydrogen peroxide-water solutions, but also after washing with these solutions, metals tend to remain on the surface of the semiconductor product.

SUMMARY OF THE INVENTION

The object of the present invention is to eliminate some of the drawbacks of the state of the art and to introduce a new and improved method for cleaning semiconductor products by washing, so that the surface of the product can be maintained essentially pure also in the post-washing process steps. The essential novel features of the invention are apparent from the appended patent claims.

According to the invention, the washing of a semiconductor product such as a silicon wafer or a gallium arsenide compound, is carried out by using a weak acid-water solution. The temperature of the weak acid-water solution of the invention is 15°–40° C., advantageously 18°–25° C. This temperature means that in the method of the invention, the weak acid-water solution is advantageously at room temperature. Thus the washing solution of the invention does not necessarily have to be heated to a particular washing temperature, which again simplifies the production of semiconductor products, and simultaneously reduces energy consumption and cleaning costs of the semiconductor products.

In the method of the invention, the employed acid may advantageously be for instance hydrochloric acid HCl, hydrofluoric acid HF, nitric acid $HNO_3$ or acetic acid $CH_3COOH$. In this kind of a weak acid-water solution, the dilution ratio may vary between $1:10^3–1:10^6$, in which case the water ratio per one part acid is between $10^3$ and $10^6$ parts respectively. Advantageously the dilution ratio of the acid-water solution is between $1:10^5–1:10^4$. The pH of the solution varies respectively between pH=1.5–6.

When defining favourable solution conditions for the process of the invention, it is important to remember that the solubility of iron increases while the pH of the solution decreases below 7. At the same time, when the pH changes towards a more acidic direction, the tendency of particles to stick on the surface of the semiconductor product grows. In addition to the behaviour of iron particles, the effect of other impurity components in the success of the washing must also be taken into account. Thus an essentially decisive factor will be the lifetime of the minority carriers in the semiconductor product. A long lifetime proves that these impurities are advantageously removed from the semiconductor in the washing.

DETAILED DESCRIPTION OF THE INVENTION

The invention is explained in more detail below with reference to the appended examples.

EXAMPLE 1

A polished silicon wafer, diameter 125 mm, was washed, according to the invention, at room temperature with weak hydrochloric acid, while the washing time was 60 s. in order to determine the influence of the hydrochloric acid content, the washing was carried out by using dilutions between $1:10^2–1:10^6$, so that the dilution ratio was changed in successive experiments with decade intervals, i.e. intervals of 1:10. Moreover, the effect of the washing time was examined by carrying out a washing, with dilution ratio $1:10^3$, also with washing times 5 s., 15 s. and 600 s. After washing, the particle content on the surface of the silicon wafer was measured.

After measuring the particle content, the silicon wafer was oxidized at the temperature 1050° C. for 30 min; in addition to this, the silicon wafer was kept 15 min at the same temperature in a nitrogen atmosphere and subjected to a minority carrier lifetime measurement by a lifetime meter based on microwave reflection, in order to reveal a possible metal contamination.

The oxidized silicon wafer was further subjected to a measurement of iron content in a known fashion. The results from these experiments are given in table 1 below, where the particle content describes an average measuring result per silicon wafer, when particles larger than 0.3 μm are taken into account in the measurement, and the employed unit of iron content is $10^{10}$ atoms per 1 $cm^3$ silicon.

| dilution ratio | particle content | lifetime µs | iron content |
|---|---|---|---|
| 1:1000000 | 1.4 | 41 | 2.7 |
| 1:100000 | 4.0 | 35 | |
| 1:10000 | 2.0 | 22 | |
| 1:1000 (5 s) | 2.5 | 27 | 3.8 |
| 1:1000 (15 s) | 3.6 | 28 | |
| 1:1000 | 1.6 | 23 | 6.7 |
| 1:1000 (600 s) | 2.7 | 20 | 12 |
| 1:100 | 4.6 | 20 | |

On the basis of table 1, the results with higher dilution ratios are better than those with lower dilution ratios, with respect to both particle content, lifetime and iron content. The length of the washing period does not seem to have an obvious influence in the results. When using the ammonia-hydrogen peroxide washing of the state of the art as a reference process, the values obtained after washing were: 1.7 particles, lifetime 5 $\alpha s$ and iron content 470. The result clearly illustrates the superiority of the method of the invention in the removal of iron.

EXAMPLE 2

In the same fashion as in example 1, a silicon wafer was subjected to the measurements of particle content, lifetime and iron content; now the employed washing reagent was tric acid with dilution ratios 1:10$^5$ and 1:10$^3$. The results from the measurements are given below in table 2, where the employed units for the results are the same as in table 1.

| dilution ratio | particle content | lifetime µs | iron content |
|---|---|---|---|
| 1:100000 | 1.8 | 30 | 4.9 |
| 1:1000 | 1.8 | 20 | 10.1 |

Table 2 shows that a lower nitric acid content (1:10$^5$) gave better results—a longer lifetime and lower iron content—than a higher nitric acid content. The change in the dilution ratio did not affect the particle content.

EXAMPLE 3

In similar fashion as in example 1, a silicon wafer was washed with acetic acid, with the same dilution ratios 1:10$^5$ and 1:10$^3$ as above in example 2, where nitric acid was used. The obtained results are given below in table 3, where the employed units are the same as above in tables 1 and 2.

| dilution ratio | particle content | lifetime µs | iron content |
|---|---|---|---|
| 1:100000 | 1.1 | 35 | 6.1 |
| 1:1000 | 4.1 | 22 | |

Like in examples 1 and 2, also here, when using acetic acid as the washing reagent, the lower acid content gave better results than the higher acid content.

EXAMPLE 4

Using the same experiment arrangements as in example 1, a silicon wafer was subjected to measurements as for the particle content on the surface of the wafer, the minority carrier lifetime and iron content of the wafer, when the washing was carried out with hydrofluoric acid. The measuring results for the dilution ratios 1:10$^5$ and 1:10$^3$ are given below in table 4.

| dilution ratio | particle content | lifetime µs | iron content |
|---|---|---|---|
| 1:100000 | 1.7 | 27 | 63 |
| 1:1000 | 2.0 | 65 | 15 |

According to table 4, when using hydrofluoric acid, the higher acid content (1:10$^3$) rendered better results as for lifetime and iron content than the lower acid content. Moreover, the iron content on the surface of the silicon wafer is essentially higher than in the previous examples. However, an essential increase in the minority carrier lifetime indicates that other impurities, such as copper, are removed from the wafer surface.

I claim:

1. A method for cleaning a semiconductor product of particles accumulated on its surface as well as of metallic and organic contamination, comprising washing the semiconductor product with an acid-water solution, with a dilution ratio between 1:10$^6$–1:10$^3$ whereby said metallic contamination is reduced without increasing said particles.

2. The method of claim 1, wherein the employed acid is hydrochloric acid.

3. The method of claim 1, wherein the employed acid is nitric acid.

4. The method of claim 1, wherein the employed acid is acetic acid.

5. The method of claim 1, wherein the employed acid is hydrofluoric acid.

6. The method of claim 1, wherein the dilution ratio is between 1:10$^5$–1:10$^4$.

7. The method of claim 6, wherein the washing is carried out at a temperature of 18-°25° C. and the employed acid is hydrochloric acid.

8. The method of claim 6, wherein the washing is carried out at a temperature of 18°–25° C. and the employed acid is nitric acid.

9. The method of claim 6, wherein the washing is carried out at a temperature of 18°–25° C. and the employed acid is acetic acid.

10. The method of claim 6, wherein the washing is carried out at a temperature of 18°–25° C. and the employed acid is hydrofluoric acid.

11. The method of claim 1, wherein the washing is carried out at a temperature of 18°–25° C.

12. A method for cleaning a semiconductor product of .particles accumulated on its surface as well as of metallic and organic contamination, comprising washing the semiconductor product with an acid-water solution, with a dilution ratio between 1:10$^6$–1:10$^3$ and wherein the washing is carried out at a temperature of 15°–40° C. whereby said metallic contamination is reduced without increasing said particles.

13. The method of claim 12, wherein the employed acid is hydrochloric acid.

14. The method of claim 12, wherein the employed acid is nitric acid.

15. The method of claim 12, wherein the employed acid is acetic acid.

16. The method of claim 12, wherein the employed acid is hydrofluoric acid.

* * * * *